(12) United States Patent
Åström (10) Patent No.: US 8,624,611 B2
(45) Date of Patent: Jan. 7, 2014

(54) ARRANGEMENT AND METHOD FOR MONITORING GALVANIC ISOLATION OF FUEL CELL DEVICE

(75) Inventor: Kim Åström, Kirkkonummi (FI)

(73) Assignee: Convion Oy, Espoo (FI)

( * ) Notice: Subject to any disclaimer, the term of this patent is extended or adjusted under 35 U.S.C. 154(b) by 355 days.

(21) Appl. No.: 13/188,170

(22) Filed: Jul. 21, 2011

(65) Prior Publication Data

US 2011/0298469 A1 Dec. 8, 2011

Related U.S. Application Data

(63) Continuation of application No. PCT/FI2009/051028, filed on Dec. 22, 2009.

(30) Foreign Application Priority Data

Jan. 23, 2009 (FI) ...................................... 20095053

(51) Int. Cl.
*G01R 27/08* (2006.01)
*H01H 31/12* (2006.01)
*H01M 8/04* (2006.01)

(52) U.S. Cl.
USPC ............ 324/713; 324/691; 324/551; 429/432

(58) Field of Classification Search
USPC ........................... 324/551, 691, 713; 429/432
See application file for complete search history.

(56) References Cited

U.S. PATENT DOCUMENTS

| | | |
|---|---|---|
| 5,760,488 A | 6/1998 | Sonntag |
| 7,564,248 B2 * | 7/2009 | Breese et al. ................. 324/691 |
| 2004/0189330 A1 | 9/2004 | Herb et al. |
| 2005/0143846 A1 | 6/2005 | Kocher et al. |
| 2006/0003198 A1 | 1/2006 | Leitz |
| 2007/0013382 A1 * | 1/2007 | Hinz et al. ..................... 324/500 |
| 2007/0285102 A1 | 12/2007 | Muller |
| 2008/0158756 A1 | 7/2008 | Lindsey et al. |

FOREIGN PATENT DOCUMENTS

| | | |
|---|---|---|
| DE | 19503749 C1 | 4/1996 |
| EP | 1437600 A1 | 7/2004 |
| JP | 9-274062 A | 10/1997 |

(Continued)

OTHER PUBLICATIONS

International Search Report (PCT/ISA/210) issued on Aug. 9, 2010, by European Patent Office as the International Searching Authority for International Application No. PCT/FI2009/050968.

(Continued)

*Primary Examiner* — Amy He (74) *Attorney, Agent, or Firm* — Buchanan Ingersoll & Rooney PC (57) ABSTRACT

A method is disclosed for monitoring galvanic isolation of a fuel cell device. At least one stack of fuel cells and at least one load circuit for fuel cells are arranged to an electrically freely floating configuration towards at least one structure near fuel cells. A controlled switching is performed via at least two switching points to at least one measurement element having known impedance in connection to the at least one structure. Measurements are performed from the measurement element to form voltage information. The voltage information and at least voltage information between switching points are processed to check floatages of fuel cells in relation to said at least one structure.

10 Claims, 4 Drawing Sheets

(56) References Cited

FOREIGN PATENT DOCUMENTS

| JP | 2007-135364 A | 5/2007 |
|---|---|---|
| JP | 2008-10178 A | 1/2008 |
| JP | 2008-22650 A | 1/2008 |
| JP | 2008-59968 A | 3/2008 |

OTHER PUBLICATIONS

International Preliminary Report on Patentability (PCT/IPEA/409) issued on Mar. 14, 2011, by European Patent Office as the International Examining Authority for International Application No. PCT/FI2009/050968.
Finnish Search Report dated Nov. 16, 2009 for Application No. FI 20086181.
Haiman Tao et al., Line-Interactive UPS Using a Fuel Cell as the Primary Source, IEEE Transactions of Industrial Electronics, vol. 55, No. 8, Aug. 2008, pp. 3012-3021.
Sangmin Jung et al., A Low Cost Utility Interactive Inverter for Residential Fuel Cell Generation, IEEE Transactions on Power Electronics, vol. 22, No. 6, Nov. 2007, pp. 2293-2298.
Guoqiao Shen et al., Instantaneous Voltage Regulated Seamless Transfer Control Strategy for Utility-interconnected Fuel Cell Inverters with an LCL-filter, IEEE 5th International Power Electronics and Motion Control Confer, Aug. 14, 2006, pp. 1-5.
International Search Report (PCT/ISA/210) issued on Jun. 22, 2010, by Finnish Patent Office as the International Searching Authority for International Application No. PCT/FI2009/051028.
International Preliminary Report on Patentability (PCT/IPEA/409) issued on Dec. 27, 2010, by Finnish Patent Office as the International Examining Authority for International Application No. PCT/FI2009/051028.
Finnish Search Report dated Nov. 3, 2009 for Application No. FI 20095053.
Written Opinion of the International Searching Authority (PCT/ISA/237) issued on Jun. 22, 2010, by Finnish Patent Office as the International Examining Authority for International Application No. PCT/FI2009/051028.

\* cited by examiner

ARRANGEMENT AND METHOD FOR MONITORING GALVANIC ISOLATION OF FUEL CELL DEVICE

RELATED APPLICATIONS

This application claims priority as a continuation application under 35 U.S.C. §120 to PCT/FI2009/051028, which was filed as an International Application on Dec. 22, 2009 designating the U.S., and which claims priority to Finnish Application 20095053 filed in Finland on Jan. 23, 2009. The entire contents of these applications are hereby incorporated by reference in their entireties.

FIELD

Fuel cell devices are used in fulfilling different kinds of electricity production needs. Fuel cell devices are electrochemical devices supplied with reactants for producing electrical energy.

BACKGROUND INFORMATION

Fuel cell devices are electrochemical devices, which enable production of electricity with high duty ratio in an environmentally friendly process. Fuel cell technology is considered to be one of the most promising future energy production methods.

Figure 1:
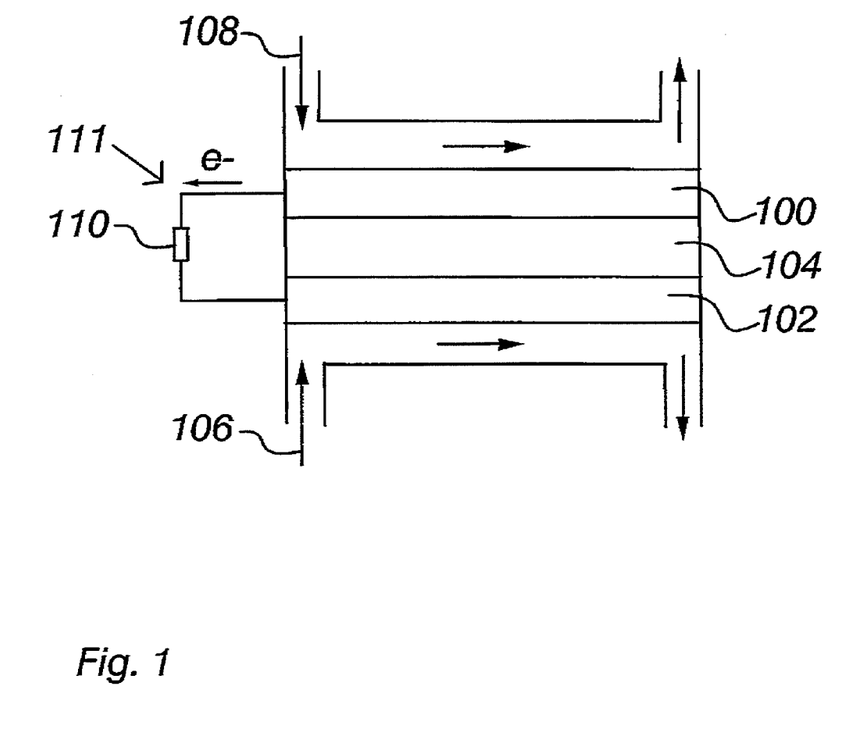
FIG. 1 shows an implementation of a single fuel cell.

A fuel cell, as presented in FIG. 1, includes an anode side 100 and a cathode side 102 and an electrolyte material 104 between them. The reactants fed to the fuel cell devices undergo a process in which electrical energy and heat are produced as a result of an exothermal reaction. For example in solid oxide fuel cells (SOFCs) oxygen 106 is fed to the cathode side 102 and it is reduced to a negative oxygen ion by receiving electrons from the cathode. The negative oxygen ion goes through the electrolyte material 104 to the anode side 100 where it reacts with the used fuel 108 producing water and, for example, carbon dioxide (CO2). Between the anode and cathode is an external electric circuit 111 as a load for fuel cell for transferring electrons e- to the cathode. External electric circuit includes a load 110.

Figure 2:
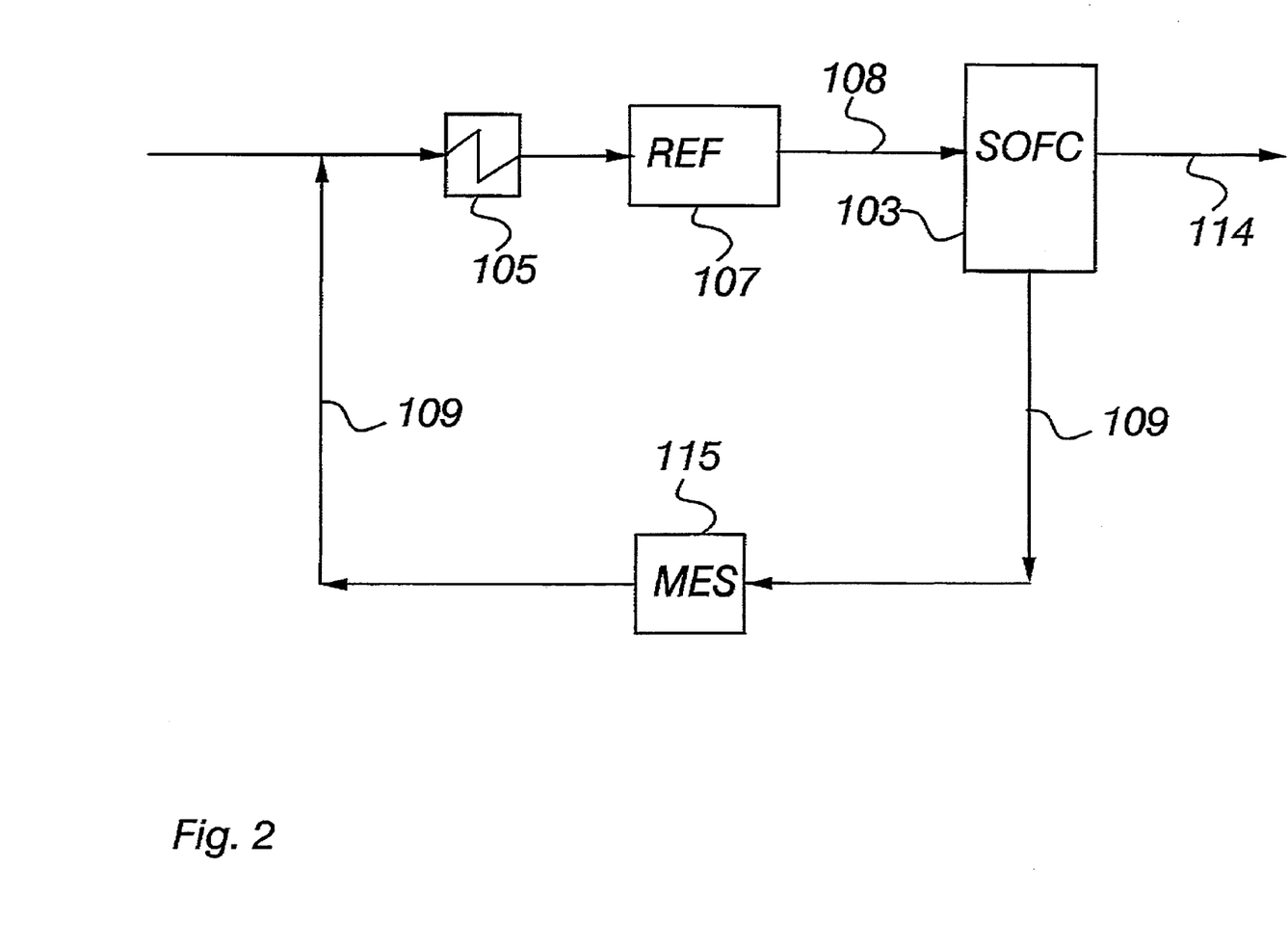
FIG. 2 shows an implementation of a fuel cell device.

In FIG. 2, a SOFC device is presented as an example of a fuel cell device which can utilize as fuel, for example, natural gas, bio gas, methanol or other compounds containing hydrocarbons. The SOFC device in FIG. 2 includes planar-like fuel cells in stack formation 103 (SOFC stack). Each fuel cell includes anode 100 and cathode 102 structure as presented in FIG. 1. Part of the used fuel is recirculated in feedback arrangement through each anode. The SOFC device in FIG. 2 includes a fuel heat exchanger 105 and a reformer 107. Heat exchangers are used for controlling thermal conditions in a fuel cell process and there can be located more than one of them in different locations of a SOFC device. The extra thermal energy in circulating gas is recovered in the heat exchanger 105 to be utilized in a SOFC device or outside in a heat recovering unit. The heat recovering heat exchanger can thus be located in different locations as presented in FIG. 2. Reformer 107 is a device that converts the fuel such as, for example, natural gas to a composition suitable for fuel cells, for example, to a composition containing half hydrogen and other half methane, carbon dioxide and inert gases. The reformer is not, however, necessary in all fuel cell implementations, but untreated fuel may also be fed directly to the fuel cells 103.

By using measurement device 115 (such as fuel flow meter, current meter and temperature meter) measurements are carried out for the operation of the SOFC device from the through anode recirculating gas. Only part of the fuel used at anodes 100 (FIG. 1) of the fuel cells 103 is recirculated through anodes in feedback arrangement 109 and thus in FIG. 2 is presented diagrammatically also as the other part of the gas is exhausted 114 from the anodes 100.

In fuel cell systems, fuel cell stacks can be grouped to serially and/or parallel connected groups. Voltage levels arising among fuel cell stacks are isolated between fuel cell stacks to avoid unwanted current loops. Exemplary voltage levels can be isolated also from installation structure of the fuel cell device, which includes for example supporting structures, and piping, which includes for example fuel feed-in lines.

Adequate and stable electronic isolation can be difficult to achieve in the case of demanding and chemically aggressive environments, such as is the case with, for example, high temperature fuel cell applications. In these contexts corrosion, thermomechanical stress, material degradation or electrochemical phenomenon, which may be caused by and/or accelerated by voltage differences of fuel cells, may each as individual phenomenon and together cause conductive routes through the isolation and/or cause isolation breakdowns. Internally arising leakage currents among fuel cells can degrade load power and may cause irreversible degradation to fuel cells, and even completely break the fuel cell stacks, which those leakage currents have had a possibility to heavily influence. These effects can be partially or totally avoided so that the galvanic isolation levels are continuously monitored and a lack of isolation is found early enough to leave time for desired protective actions.

Deterioration of the isolation may not be easily detected in voltage and/or current measurements outside of the fuel cell device. If the fuel cell stacks are electrically unfloating, fault current measurement can be used to monitor leakage currents. However, this method is not proper to identify locations of leakage currents, and is not proper to observe leakage currents inside the fuel cell device.

SUMMARY

A measurement arrangement is disclosed for monitoring galvanic isolation of a fuel cell device having at least one stack of fuel cells, at least one load circuit for fuel cells, and at least one ground potential structure connected to protective grounding near the at least one said stack, wherein the measurement arrangement comprises: at least one measurement element having known impedance for connection to at least one ground potential structure of at least one stack of fuel cells; means for performing measurements from the measurement element to form voltage information of floatage conditions of fuel cells towards said ground potential structure; at least two switches for switching at least two switching points of the fuel cells to said measurement element; and means for monitoring galvanic isolation including at least one signal processor for controlling said switches during measurements, and for processing said formed voltage information and at least voltage information between the switching points to form resistance information and capacitance information of galvanic isolation, wherein the capacitance information is based on a comparability between capacitance values and an exponential constant of a voltage information curve, and said at least one signal processor is provided for combining said resistance and capacitance information to form information on a condition of the galvanic isolation and information on possible alteration of said condition.

A method is disclosed for monitoring galvanic isolation of a fuel cell device, in which at least one ground potential structure is connected to protective grounding, and a current processor is a load circuit for fuel cells of the fuel cell device, the current processor having power electronics for processing direct current produced by the fuel cells, the method comprising: arranging at least one stack of fuel cells and said at least one load circuit for fuel cells to an electrically freely floating configuration towards said at least one ground potential structure near fuel cells; performing a controlled switching via at least two switching points to at least one measurement element having known impedance in connection to said at least one ground potential structure, said switching points being in connection to voltage values of the fuel cells; performing measurements from the measurement element to form voltage information; processing said formed voltage information and at least voltage information between switching points to form resistance information and capacitance information of galvanic isolation, the forming of capacitance information being based on a comparability between capacitance values and an exponential constant of voltage information curve; and combining said resistance and capacitance information to form information on a condition of galvanic isolation and information on possible alteration of said condition.

DETAILED DESCRIPTION

As discussed herein, galvanic isolation in a fuel cell device can be monitored so that deteriorations in isolation are detected early so that expensive and harmful consequences caused by breakdowns of isolation are successfully avoided. Exemplary embodiments include a measurement arrangement for monitoring galvanic isolation of a fuel cell device, which fuel cell device comprises at least one stack of fuel cells, at least one load circuit for fuel cells, and at least one structure near the at least one stack. The fuel cell device can comprise a load circuit current processing means comprising power electronics for processing direct current (dc-current) produced by fuel cells The fuel cell device can comprise galvanic isolation for disposing said at least one stack of fuel cells and said at least one load circuit for fuel cells to an electrically freely floating configuration towards at least one structure.

The measurement arrangement can comprise at least one measurement element having known impedance in connection to said at least one structure, and means (e.g., a processor device and memory) for performing measurements from the measurement element to form voltage information of floatage of fuel cells towards said structure.

The fuel cell device can include at least two switching points The measurement arrangement can include at least two switches for switching the switching points to said measurement element The measurement arrangement can comprise, for monitoring galvanic isolation, at least one signal processor to control the switches in (i.e., during) measurements, and to process said formed voltage information and at least voltage information between switching points to form resistance information and capacitance information of galvanic isolation. The forming of capacitance information can be based on the comparability (e.g., by way of comparison) between capacitance values and an exponential constant of voltage information curve, and said at least one signal processor for combining said resistance and capacitance information to form information on a condition of galvanic isolation and information on possible alteration of said condition.

A method is disclosed for monitoring galvanic isolation of a fuel cell device. In the method, current processing means (e.g., current sensor and processor device) can be used as a load circuit for fuel cells, said current processing means comprising power electronics for processing direct current (dc-current) produced by fuel cells. At least one stack of fuel cells and said at least one load circuit for fuel cells can be arranged to an electrically freely floating configuration towards at least one structure near fuel cells A controlled switching can be performed via at least two switching points to at least one measurement element having known impedance in connection to said at least one structure. Measurements can be performed from the measurement element to form voltage information. The voltage information and at least voltage information can be processed between switching points to form resistance information and capacitance information of galvanic isolation. The forming of capacitance information can be based on the comparability between capacitance values and an exponential constant of voltage information curve, and said the resistance and capacitance information can be combined to form information on a condition of galvanic isolation and information on possible alteration of said condition.

According to the present disclosure, fuel cells and at least one load circuit for fuel cells can be arranged to an electrically freely floating configuration towards at least one structure in the vicinity of fuel cells. Switches can be used to perform switchings to the at least one measurement element, which has a fixed (e.g., substantially fixed to ±10%) impedance which remains substantially the same during the implementation of the disclosure. The impedance is in galvanic connection to at least one structure in the vicinity of the fuel cells.

Measurement information of floatage of fuel cells towards the structure can be formed by performing measurements from the measurement element in the moments of different switchings during operation of the fuel cell device. Measurement information can be processed by calculation in different ways for solving, for example, locations and/or values of leakage currents transpiring in galvanic isolation of the fuel cell device. Measurement information can also be processed by calculation for forming information on capacitance values of galvanic isolation. The capacitance values can include information on possible routes of spurious signals in galvanic isolation.

Exemplary embodiments can provide an advantage that information obtained from leakage currents in isolation and their location, and also from possible flow paths of spurious signals, can be utilized in preventing operation problems of a fuel cell device caused by isolation defects for example by initiating early preventive service works for the fuel cell device. Thanks to monitoring of galvanic isolation according to the disclosure, new isolation defects can be detected immediately and these defects can be prevented from getting worse, thus enabling an increase in the number of serially connected fuel cell stacks.

Exemplary embodiments of the disclosure can be utilized in any fuel cell device, which comprises one or more of fuel cell stack(s) disposed in electrically free-floating configuration. In addition, exemplary methods of the disclosure can be implemented with inexpensive components with no need to make additional connections to the fuel cells. It is also substantially useful that exemplary implementations according to the disclosure allow measurements, and hence the monitoring of galvanic isolation, while fuel cells are loaded, without disrupting the loading power electronics.

In fuel cell systems, galvanic isolation can be included between fuel cell stacks, and between the fuel cell stacks and at least one structure in the vicinity of the fuel cells. The structure means, for example an installation structure, is located essentially around the fuel cell stacks. In other words, the structure 122 (FIG. 3) includes one or more installation structures in the vicinity of the fuel cell stacks, and other structure such as pipelines, from which fuel cell stacks are to be galvanically isolated.

Adequate and stable electronic isolation can be difficult to achieve in the case of demanding and chemically aggressive environments such as is the case with, for example, high temperature fuel cell applications. Isolation breakdowns or reducing of isolation can cause leakage currents, which reduce the amount of electrical power available to the load, and can cause irreversible weakening of power to the fuel cell device and even breakdowns of fuel cell stacks, which have been exposed to leakage currents. These negative effects can be entirely avoidable, or at least in part avoidable, when a quality of galvanic isolation is monitored during operation of the fuel cell device and a decreased amount of isolation is detected early enough to initiate security works (e.g., preventative and/or repair measures.

In accordance with the disclosure, an exemplary low cost implementation is disclosed to continuously monitor galvanic isolation characteristics during operation of a fuel cell device. In an exemplary implementation according to the disclosure, fuel cells and their loads are electrically floating in relation to the surrounding structures, such as grounding and/or installation structure, to which leakage currents are conducted. A load 110 of fuel cells is included in a loading electrical circuit 111 for fuel cells for example current processing means integrated in context with the fuel cell device, said current processing means comprising power electronics for processing direct current (dc-current) produced by fuel cells.

Figure 3:
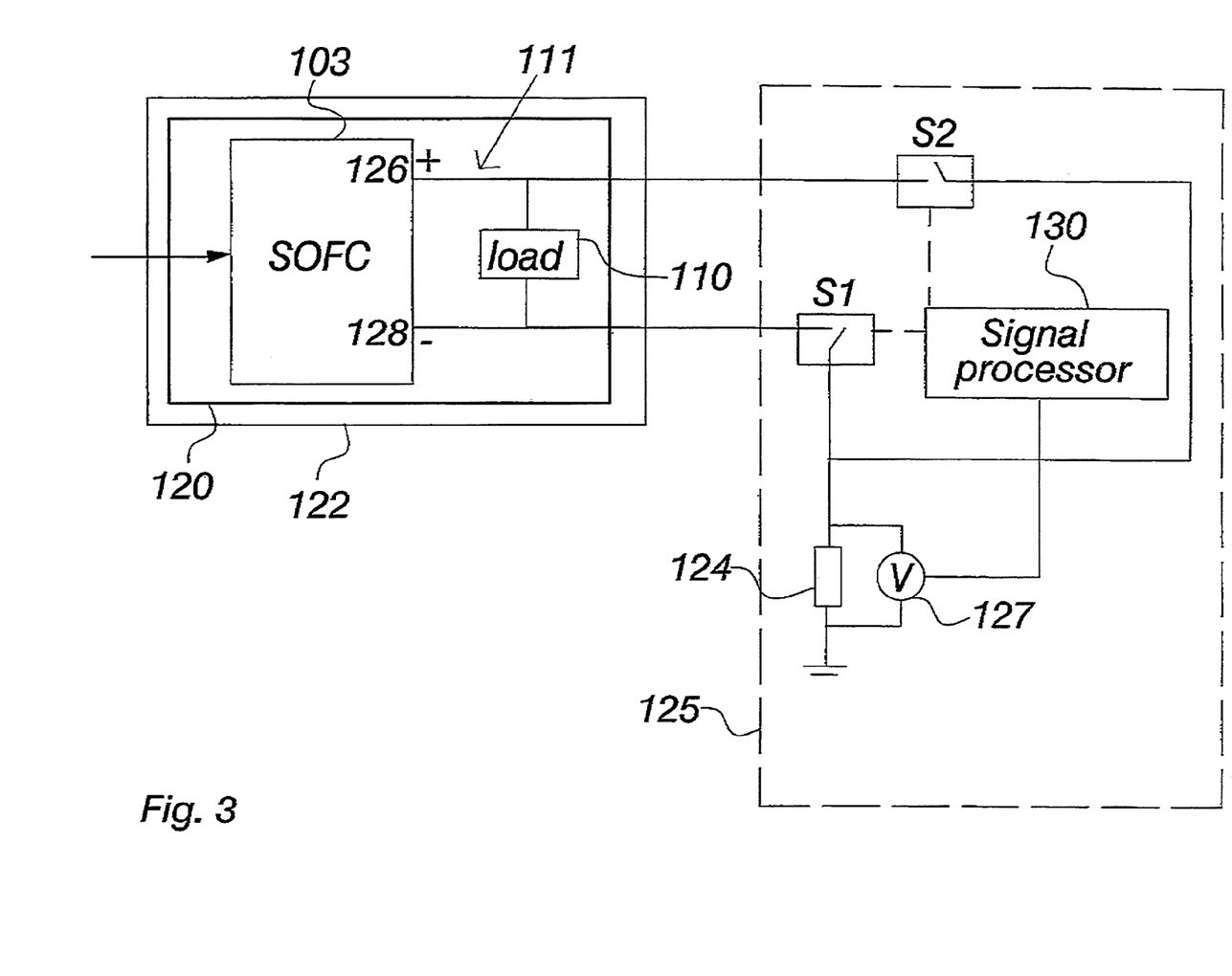
FIG. 3 shows a measurement arrangement integrated to the fuel cell device according to an exemplary embodiment of the disclosure.

In FIG. 3 a measurement arrangement 125 is presented for monitoring galvanic isolation 120 implemented in context with the fuel cell device according to an exemplary embodiment of the disclosure.

The fuel cell device can include fuel cell stack 103, an installation structure 122, which locates substantially around the fuel cell stacks, and a loading electrical circuit 111 for fuel cells. The installation structure and other possible structures attached to it are, for example, connected to a protective potential. Galvanic isolation 120 is formed between fuel cell stacks 103 and installation structure 122 and if desired also between fuel cell stacks and piping 122 for disposing the fuel cell stacks and the loading electrical circuit 111 for fuel cells to an electronically freely floating configuration in relation to said installation structure and, if desired, in relation to the piping. The loading electrical circuit for fuel cells according to an exemplary embodiment of the disclosure comprises as the load 110, for example, a DC power converter (DC-DC converter) for processing electricity produced by the fuel cells.

The measurement arrangement 125 implemented with the fuel cell device can comprise at least one measurement element 124, which has a known impedance towards the installation structure 122. In an exemplary embodiment of the disclosure, the measurement element 124 is at least one measurement resistor, but the measurement element 124 can also be implemented with one or more capacitor(s) or coil(s), or with some combination of one or more resistor(s), capacitor(s) and/or coil(s), or other suitable device. The measurement arrangement in accordance with the disclosure may also comprise measurement elements for forming different measurement areas, which have different impedances between each other towards the installation structure.

The fuel cell device can comprise at least two output poles (e.g., switching points plus pole (+) 126 and minus pole (−) 128), to which connected the measurement arrangement comprises switches S1 and S2 for performing switchings via the switching points 126, 128 to the measurement resistor 124. The switches are, for example, each controlled in turn to open or closed conditions by the controlling of a signal processor 130. An exemplary embodiment of the disclosure comprises means 127 for measuring voltage of the measurement resistor for forming voltage information. Formed voltage information is processed by the signal processor 130 so that, for example, they are compared to a reference voltage level for checking floatage of the fuel cell stacks 103 and the loading circuit 111 for the fuel cell stacks in relation to the installation structure. An implementation in accordance with the disclosure also involves a voltage information of fuel cell voltage ($U_{FC}$, FIG. 4), obtained by voltage measurements of voltage between switching points 126, 128 if, for example, said voltage information is not otherwise known.

On the basis of voltage information from different locations of isolation, isolation resistance values in the processing of voltage information can be determined, said values reporting that leakage currents exists in said locations. In the voltage information processing the same common signal processor 130 can be used, which can be also used in control of switches S1, S2, or signal processors may also be separate. The signal processors may be analog and/or digitally implemented micro controllers, signal processors, microprocessors, or other suitable implementations for the purpose. In an exemplary embodiment of the disclosure, a signal processing device 130 is used.

Figure 4:
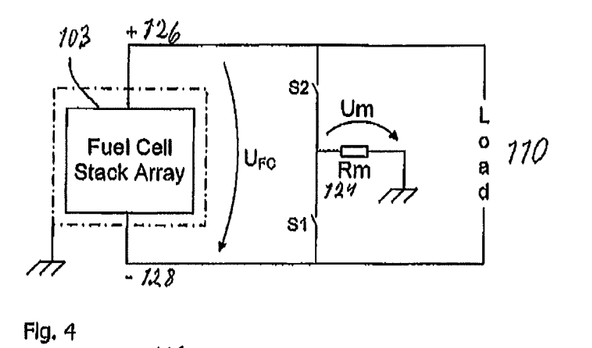
FIG. 4 shows monitoring of isolation resistance according to an exemplary embodiment of the disclosure, in which positive and negative outputs of fuel cell stacks are connected in turn to grounding potential and/or to potential of a structure in a vicinity of fuel cell stacks via a measuring resistor Rm.

In FIG. 4, the isolation resistance monitoring is presented in such a way that the positive and negative outputs 126, 128 of fuel cell stacks 103 are switched in turn to grounding potential and/or to potential of the installation structure via the measurement resistor Rm 124 to measure voltage (Um) over Rm. Switches S1 and S2 may be semiconductor components, such as transistor switches, or changed to other switch implementations. In an exemplary implementation according to the disclosure, fuel cell stack voltage ($U_{FC}$) over one or more fuel cell stacks can be measured by means for measuring fuel cell voltage from the switch points 126 (+) and 128 (−); (according to FIG. 3). It is also possible that the $U_{FC}$ is a known voltage without measurements during the implementation of the disclosure, such as is the case, for example, in an embodiment in which the fuel cell device is connected to a battery, which voltage between its poles is known.

Figure 5:
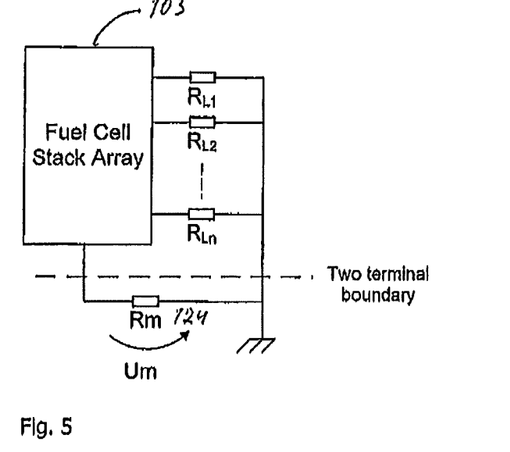
FIG. 5 shows an exemplary equivalent circuit for leakage currents, when the switch S1 is closed and the load is very isolated.

In FIG. 5 an equivalent circuit for leakage currents is presented, when the switch S1 is closed, provided that the load is very isolated, which is usually easily implemented. Leakage currents to a potential of the installation structure surrounding the fuel cell stacks can occur from different voltage levels of fuel cell stacks, presented by resistors, (e.g., resistances $R_{Ln}$ in FIG. 5). In this case, fuel cell stacks and leakage resistances form a set of voltage sources and resistances. The voltage sources can be considered to be ideal as compared to minor currents via the measurement resistor Rm 124, and leakage resistances can be considered to be linear.

Figure 6:
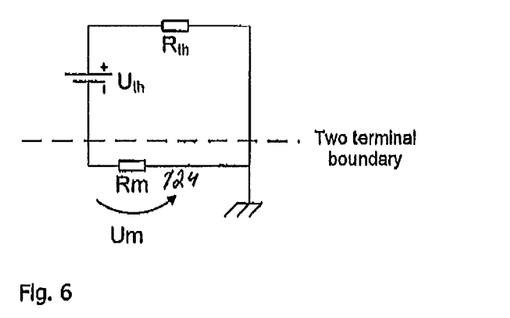
FIG. 6 shows application of Thevenin's theorem in formation of an exemplary equivalent circuit for two interfaces of outputs of voltage sources and resistors.

Thus, Thevenin's theorem can be applied in accordance with FIG. 6 in formation of equivalent circuit to two interfaces of a set of voltage sources and resistors. According to Thevenin's theorem, every corresponding set, which has two outputs can be represented by a single voltage source $U_{th}$ and with a serial connected resistor $R_{th}$ in relation to $U_{th}$. Thevenin's theorem applies also when S1 is open and S2 closed, forming a corresponding equivalent circuit where the voltage source $U_{th}$ is replaced by the voltage source $U_{th}$-$U_{FC}$ when using the negative output of the set of fuel cell stacks 103 as zero voltage reference.

Indicating measured voltages $Um_1$ and $Um_2$, measured when the switches S1 and S2 are in turn closed, the unknowns $U_{th}$ and $R_{th}$ of equation group can be solved:

$$R_{th}=R_m(U_{FC}+U_{m1}-U_{m2})/(U_{m2}-U_{m1})$$

$$U_{th}=-U_{m1}(U_{FC})/(U_{m2}-U_{m1})$$

$U_{th}$ corresponds to open circuit Thevenin voltage, which means in this embodiment according to the disclosure an inverted value of voltage of negative output for the set of fuel cell stacks, when external load is not exposed to the leakage circuit (e.g., switches S1 and S2 are open in FIGS. 3 and 4), this meaning that measuring resistor Rm 124 has been removed. By applying Thevenin's theorem resistance, $R_{th}$ corresponds to leakage resistance of parallel connected total resistance of all leakage resistances (i.e., Rth=$R_{L1}$||$R_{L2}$|| . . . ||$R_{Ln}$). Thus, solved voltage $U_{th}$ gives an indication of a location of an isolation defect in relation to zero voltage reference, while $R_{th}$ represents a worst case internal leakage current among the fuel cells. A measurement procedure, such as alternate closing and opening of switches S1 and S2, does not affect operation of the isolated load, and thus the measurement operation can be carried out continuously during operation of the fuel cell device. Because of a configuration of floating stacks 103, a single connection to a chassis does not affect the fuel cells, but it is nevertheless observed with exemplary measurement methods according to the disclosure thus allowing, for example, the operation of the fuel cell device to be discontinued, before a destructive internal current loop arises among the fuel cell stacks. At such an early stage, formed indication information on changes in isolation properties of the fuel cell device can be utilized in preventive service works for a fuel cell device at a right time (e.g., optimum).

In an exemplary implementation according to the disclosure, an electrical equivalent circuit is formed to determine locations of leakage currents by grounding performed by one or more measurement elements. The exponential shape of a measurement curve is an indication of measured capacitance. The value of a dielectric constant is affected by moisture, temperature, and so forth. By more dense measuring of measurement values or by calculation of the exponential shape of a voltage information curve, performance can be improved and the exponential constant can be found to be proportional to the capacitance. From measurement data, it can be observed that if the change in speed is slow at the time of switching, a significant amount of capacitance exists. Voltage information can be calculated by the signal processor and change dynamics of voltage values related to switch condition changes can be determined, which can be utilized in the forming of capacitance information.

Capacitance can be a harmful phenomenon, because it indicates an alternation in isolation. Capacitance and resistance information, formed together and also separately, can be utilized in a complementary way in forming information on galvanic isolation and its alternations, Effective capacitance reflects the fact that from isolation can be found a path for spurious signals to move ahead. Resistance reflects the fact that leakage current is occurring in isolation.

According to the disclosure, an active method is disclosed, which allows continuous monitoring of total isolation resistance and total capacitance of floating fuel stacks in a fuel cell device. Isolation resistance towards unfloating voltage of installation structure around the fuel cell stacks (e.g., towards voltage of installation structure of fuel cell stacks) can be measured by means, which switches in sequences of outputs of fuel cell stacks to the installation via the measurement element which has known impedance, by measuring voltage over the measurement element. An impedance value of the measurement element need not be exactly known, but it is desirable that impedance remains substantially the same during implementation of the disclosure. According to circuit theory, total leakage resistance can be determined on the basis of measurements and information, provided by the measurements, on amount of leakages in different locations. Information obtained in this way can be utilized for preventing failures of fuel cell stacks caused by isolation defects as well as in preventive maintenance work for the fuel cell device.

The set of fuel cell stacks in exemplary methods according to the disclosure can be a single fuel cell stack or any size of sets of fuel cell stacks. The fuel cell device may comprise one or more sets of fuel cell stacks, and monitoring of isolation resistance and/or capacitance can be arranged for one or more fuel cell stack(s) individually or together for all fuel cell stacks. Methods according to the disclosure can be implemented so that the measurement arrangement is disposed on a separate device and/or integrated to power electronics of the fuel cell device, which can also be a load of the fuel cell device, thus allowing to keep the number of component and manufacturing costs at a minimum.

Although the above is presented together with the figures and for utilization of implementations according to the disclosure in SOFC fuel cell devices, it should be noted that implementations according to the disclosure can be utilized also in other kinds of fuel devices.

Although the disclosure has been presented with reference to the attached figures and specification, the disclosure is not limited to those as the disclosure is subject to variations within the scope allowed for by the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A measurement arrangement for monitoring galvanic isolation of a fuel cell device having at least one stack of fuel cells, at least one load circuit for fuel cells, and at least one ground potential structure connected to protective grounding near the at least one said stack, wherein the measurement arrangement comprises:
- at least one measurement element having known impedance for connection to at least one ground potential structure of at least one stack of fuel cells;
- means for performing measurements from the measurement element to form voltage information of floatage conditions of fuel cells towards said ground potential structure;
- at least two switches for switching at least two switching points of the fuel cells to said measurement element; and
- means for monitoring galvanic isolation including at least one signal processor for controlling said switches during measurements, and for processing said formed voltage information and at least voltage information between the switching points to form resistance information and capacitance information of galvanic isolation, wherein the capacitance information is based on a comparability between capacitance values and an exponential constant of a voltage information curve, and said at least one signal processor is provided for combining said resistance and capacitance information to form information on a condition of the galvanic isolation and information on possible alteration of said condition.

2. A measurement arrangement in accordance with claim 1, in combination with the fuel cell device, wherein the fuel cell device comprises:
- a load circuit current processing means having power electronics for processing direct current produced by the at least one stack;
- at least two switching points, said switching points being in connection to voltage values of the fuel cells; and
- galvanic isolation for disposing said at least one stack of fuel cells and said at least one load circuit for fuel cells to an electrically freely floating configuration towards the at least one ground potential structure.

3. A measurement arrangement in accordance with claim 2, wherein the fuel cell device comprises:
- at least one DC-DC converter as load for the fuel cells.

4. A measurement arrangement in accordance with claim 1, wherein the measurement arrangement comprises:
- measurement elements for forming different measurement areas, said measurement elements having different impedances between them.

5. A measurement arrangement in accordance with claim 1, wherein the signal processor for processing voltage information is configured for calculating estimations for change dynamics of voltage information related to switch condition changes of switches in forming of capacitance information.

6. A measurement arrangement in accordance with claim 1, wherein the measurement arrangement is integrated to control electronics of power electronics, wherein the power electronics is provided for performing current processing of the fuel cell device.

7. A method for monitoring galvanic isolation of a fuel cell device, in which at least one ground potential structure is connected to protective grounding, and a current processor is a load circuit for fuel cells of the fuel cell device, the current processor having power electronics for processing direct current produced by the fuel cells, the method comprising:
- arranging at least one stack of fuel cells and said at least one load circuit for fuel cells to an electrically freely floating configuration towards said at least one ground potential structure near fuel cells;
- performing a controlled switching via at least two switching points to at least one measurement element having known impedance in connection to said at least one ground potential structure, said switching points being in connection to voltage values of the fuel cells;
- performing measurements from the measurement element to form voltage information;
- processing said formed voltage information and at least voltage information between switching points to form resistance information and capacitance information of galvanic isolation, the forming of capacitance information being based on a comparability between capacitance values and an exponential constant of voltage information curve; and
- combining said resistance and capacitance information to form information on a condition of galvanic isolation and information on possible alteration of said condition.

8. A method in accordance with claim 7, comprising:
- forming different measurement areas using measurement elements, said measurement elements having different impedances between them.

9. A method in accordance with claim 7, comprising:
- forming capacitance information voltage information by calculating estimations for change dynamics of voltage information related to switch condition changes of switches.

10. A method in accordance with claim 7, comprising:
- processing direct current produced by the fuel cells by at least one DC-DC converter, which is a load for the fuel cells.

* * * * *